United States Patent
Bechtel et al.

(10) Patent No.: US 7,859,185 B2
(45) Date of Patent: Dec. 28, 2010

(54) LIGHT-EMITTING DEVICE

(75) Inventors: Hans-Helmut Bechtel, Roetgen (DE); Wolfgang Busselt, Roetgen (DE); Peter Schmidt, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 148 days.

(21) Appl. No.: 12/162,072

(22) PCT Filed: Jan. 15, 2007

(86) PCT No.: PCT/IB2007/050112

§ 371 (c)(1),
(2), (4) Date: Jul. 24, 2008

(87) PCT Pub. No.: WO2007/085977

PCT Pub. Date: Aug. 2, 2007

(65) Prior Publication Data

US 2009/0026908 A1    Jan. 29, 2009

(30) Foreign Application Priority Data

Jan. 24, 2006 (EP) .................. 06100745

(51) Int. Cl.
*H01J 1/62* (2006.01)
*H01J 63/04* (2006.01)

(52) U.S. Cl. ............... 313/502; 313/498; 313/503; 313/506; 313/512

(58) Field of Classification Search .......... 313/498–512
See application file for complete search history.

(56) References Cited

U.S. PATENT DOCUMENTS

| | | | |
|---|---|---|---|
| 6,653,765 B1 | 11/2003 | Levinson et al. | |
| 2003/0038596 A1 | 2/2003 | Ho | |
| 2004/0218390 A1* | 11/2004 | Holman et al. | 362/245 |
| 2005/0051777 A1* | 3/2005 | Hill | 257/72 |
| 2005/0194603 A1 | 9/2005 | Slater, Jr. et al. | |
| 2005/0269582 A1 | 12/2005 | Mueller et al. | |
| 2006/0097385 A1* | 5/2006 | Negley | 257/722 |
| 2006/0203468 A1* | 9/2006 | Beeson et al. | 362/84 |
| 2007/0023762 A1* | 2/2007 | Gumins et al. | 257/79 |
| 2008/0265268 A1* | 10/2008 | Braune et al. | 257/98 |

OTHER PUBLICATIONS

Written Opinion; Applic. No. PCT/IB2007/050112.

* cited by examiner

*Primary Examiner*—Bumsuk Won
*Assistant Examiner*—Kevin Quarterman

(57) ABSTRACT

A light-emitting device comprising a solid-state light source (3), at least one conversion element (4) and a light-scattering element (6), wherein the solid-state light source (3) is provided to emit a first part (511) of a primary radiation for entry into the light-scattering element (6) and a second part (512) of a primary radiation for entry into the conversion element (4) for at least partial conversion into at least one secondary radiation (521, 522), the light-scattering element (6) is provided to generate a mixed radiation (5) having a Lambertian light distribution pattern from the first part (511) of the primary radiation, the secondary radiation (521, 522) and a portion of the second part (512) of the primary radiation that has not been converted in the conversion element (4), and the first part (511) of the primary radiation leaves the light-emitting device without having passed the conversion element (4).

12 Claims, 4 Drawing Sheets

LIGHT-EMITTING DEVICE

Figure 1:
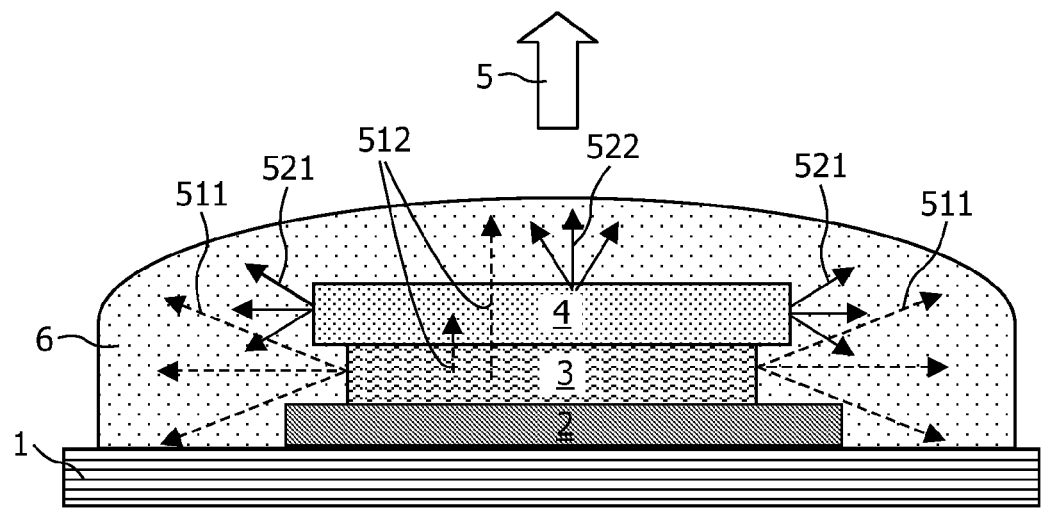

The invention relates to a light-emitting device having a high efficiency and a cosinusoidal light distribution, comprising a solid-state light source and an element for light conversion.

Phosphor-converted electroluminescent devices (pcLEDs) comprising an electroluminescent light source (LED) and a light-converting phosphor layer, typically a phosphor-powder layer or a polycrystalline-phosphor layer are known. In such pcLEDs, the LED emits a primary radiation, at least a part of which is absorbed by a phosphor layer (conversion element) arranged on the LED, and is re-emitted as longer-wave secondary radiation. This method is also denoted as color or light conversion. Dependent on the application, the primary radiation is converted completely into secondary radiation, or in a partial conversion, differently colored light, for example, white light may be produced by mixing the primary and secondary radiation. While the secondary radiation is radiated non-directionally in the active material and thus essentially with a cosinusoidal angular distribution from the conversion element in the case of a powder layer, the unconverted primary radiation has an average direction of radiation, which is defined by the layer structure of the solid-state light source and, as a rule, deviates significantly from that of a light-emitting layer. The mixed light produced by superposing the primary and secondary radiation therefore has no intensity distribution (Lambertian light distribution) which is cosinusoidally dependent on the viewing angle, and the resulting mixed color changes significantly as a function of the angle of radiation. The light distribution desired by the user is a Lambertian distribution pattern, which is distinguished by the fact that the intensity is maximum in the forward direction.

U.S. Pat. No. 6,653,765 discloses a light source having a component emitting in the blue or the ultraviolet spectral range (primary radiation), for example, a LED, as well as a layer of phosphor material for at least partial conversion of the primary radiation into secondary radiation, and a layer of light-scattering material for generating a Lambertian light distribution pattern for the light source. Light-scattering particles serve as light-scattering material, which particles are arranged preferably between light-emitting components and phosphor material, as the optimally scattering particle size then has to be adapted only to the wavelength of the primary radiation. The particle size of the light-scattering particles should be between 1/10 of the wavelength and up to 10 times the wavelength. An optimal scattering behavior is obtained with a particle size which is equal to the wavelength, for example, a particle size of 0.3 μm for ultraviolet primary radiation.

The phosphor material is arranged in the light source disclosed in U.S. Pat. No. 6,653,765 in such a way that the total primary radiation (100%) for producing a homogeneous color point impinges upon the phosphor layer. In one embodiment, the LED is enveloped completely by the phosphor layer, in other embodiments reflectors are used for the complete deflection of the primary radiation onto the phosphor material. The phosphor layers are manufactured by means of the usual wet-chemical methods from a suspension, or as a powder layer with a supporting matrix material. These layers have a highly intrinsic scattering power. The efficiency (luminous efficacy) of the disclosed light source is negatively influenced by backscattering effects and radiationless (re)absorption processes in the phosphor material.

It is therefore an object of the invention to provide a light-emitting device having a Lambertian light distribution, which is characterized by an improved luminous efficacy.

The object of the invention is achieved by a light-emitting device comprising a solid-state light source, at least one conversion element and a light-scattering element, wherein the solid-state light source is provided to emit a first part of a primary radiation for entry into the light-scattering element and a second part of a primary radiation for entry into the conversion element for at least partial conversion into at least one secondary radiation, the light-scattering element is provided to generate a mixed radiation having a Lambertian light distribution from the first part of the primary radiation, the secondary radiation and the portion of the second part of the primary radiation that has not been converted in the conversion element, and the first part of the primary radiation leaves the light-emitting device without having passed the conversion element. Consequently, light losses due to radiationless absorption in the conversion element are avoided at least for the first part of the primary radiation, as it does not pass the conversion element, neither before entering into the light-scattering element nor after exiting from the light-scattering element. According to the invention, a light-emitting device thus has an increased efficiency at the same color point in comparison with the state of the art. One or several non-organic and/or organic LEDs or laser diodes may be used as a solid-state light source. The independent claim expressly comprises also the embodiments of light-emitting devices with complete conversion of the second part of the primary radiation into secondary radiation.

In an embodiment, the conversion element comprises a ceramic material having a density which is larger than 97% of the theoretical solid-state density of the crystalline connection. Due to the small intrinsic scattering effect, such a conversion element emits a higher portion of the secondary radiation perpendicularly to the average direction of propagation of the second part of the primary radiation. This leads to a better miscibility of the first part of the primary radiation with the secondary radiation. Additionally, the small scattering effect reduces the average length of the optical path for primary and secondary radiation into the conversion element. Thus, the portion of the radiationless re-absorption in the conversion element is additionally reduced and, consequently, the efficiency of the light-emitting device is further increased.

In a further embodiment, the conversion element has a thickness of at least 30 μm in the average direction of radiation of the second part of the primary radiation. With such thick conversion elements, a sufficiently large variation of absorption strengths may be obtained for adjusting the desired color points of the mixed light.

In a further embodiment, the solid-state light source, viewed in the direction of radiation of the mixed light, has a light-emitting surface which is larger than or equal to the surface of the conversion element, which faces the solid-state light source. In this way, the portion of the first part of the primary radiation may be increased for the total primary radiation. In this embodiment, at least the total primary radiation exiting laterally from the solid-state light source does not pass the conversion element. Here, the light denoted as "laterally exiting" leaves the solid-state light source through the surface, which is essentially arranged perpendicularly to the average direction of propagation of the primary radiation. The larger the portion of the first part of the primary radiation for the total primary radiation, the lesser the primary radiation is lost through radiationless re-absorption, and the light-emitting arrangement is thus more effective.

In a further embodiment, the conversion element has at least one opening, through which the primary radiation can pass without passing the conversion element. The required increase in the portion of the first part of the primary radiation for the total primary radiation further increases the effectiveness of the light-emitting device. The average direction of propagation of the portion of the primary radiation that passes through the openings is at least very similar to the average direction of propagation of the secondary radiation and renders a less expensive light-scattering element possible for generating a Lambertian light distribution pattern. Here, the openings are not to be understood as portions of the conversion element.

In a further embodiment, the conversion element is optically coupled to the solid-state light source for reducing back reflections at the boundary surfaces.

In a further embodiment, the light-scattering element encloses the solid-state light source and the conversion element. Generating a Lambertian light distribution pattern is thus facilitated.

In a further embodiment, the light-emitting device further comprises a lens, which encloses the solid-state light source, the conversion element and the light-scattering element. The lens enables a desired deflection or a focusing of the mixed light.

In a further embodiment, the color point of the mixed light is adjusted via a portion of unconverted primary radiation that is adjustable by means of the scattering properties of the light-scattering element, which primary radiation is scattered back to the conversion element for conversion into secondary radiation. The color point may be finely adjusted due to appropriately adapted scattering properties, for example, as a reaction to production-dependent, slightly varying absorption properties of the conversion elements or slightly varying wavelengths of the primary radiation. Alternatively, light-emitting devices may thus also be manufactured with color points adapted to different requirements while using the same solid-state light sources and conversion elements.

In an embodiment, the adaptation of the light-scattering element may be obtained in that the light-scattering element comprises reflective and/or refractive particles of the same or different size, material and concentration for producing a mixed radiation having a Lambertian light distribution.

In a further embodiment, the particles comprise materials from the group of pigments for absorbing primary and/or secondary radiation. The pigments may absorb the primary and secondary radiation exclusively, or in another embodiment, subsequently re-emit them at a different wavelength after absorption. With these pigments, the correlated color temperature of the light-emitting device may be adapted still more purposefully.

These and other aspects of the invention are apparent from and will be elucidated with reference to the embodiments described hereinafter.

Figure 2:
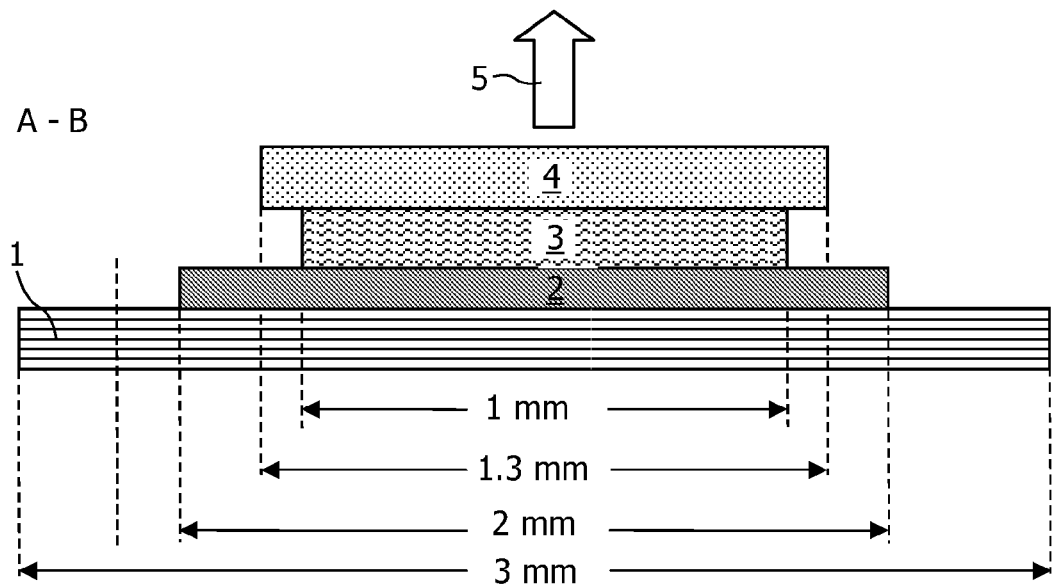
Figure 3:
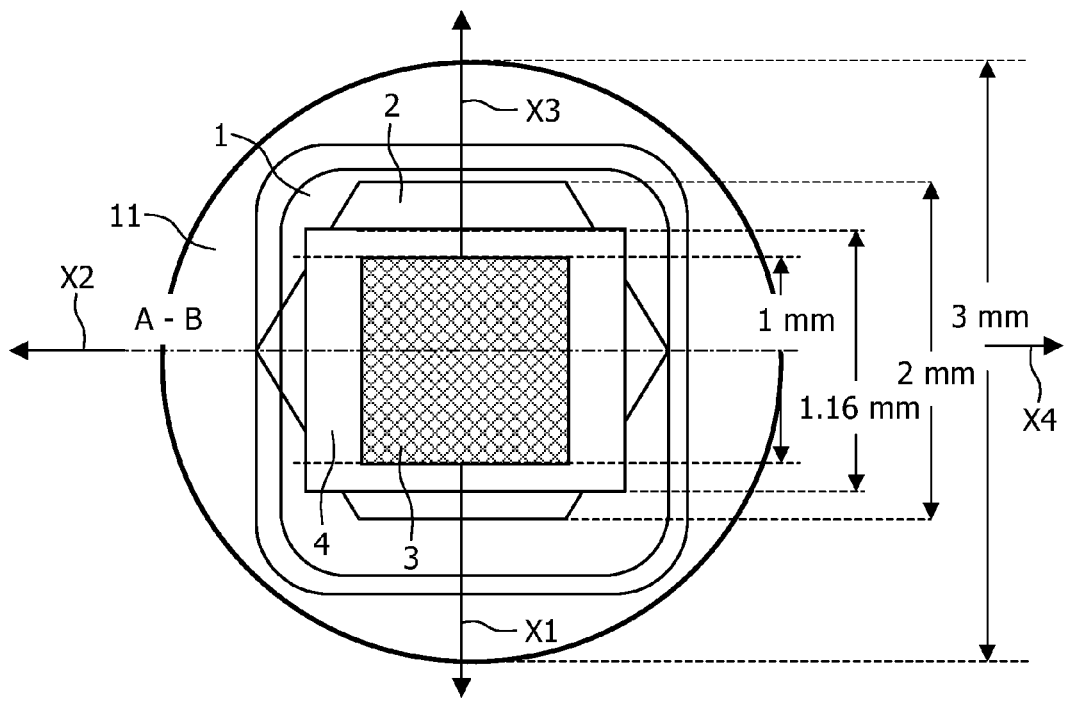
Figure 4:
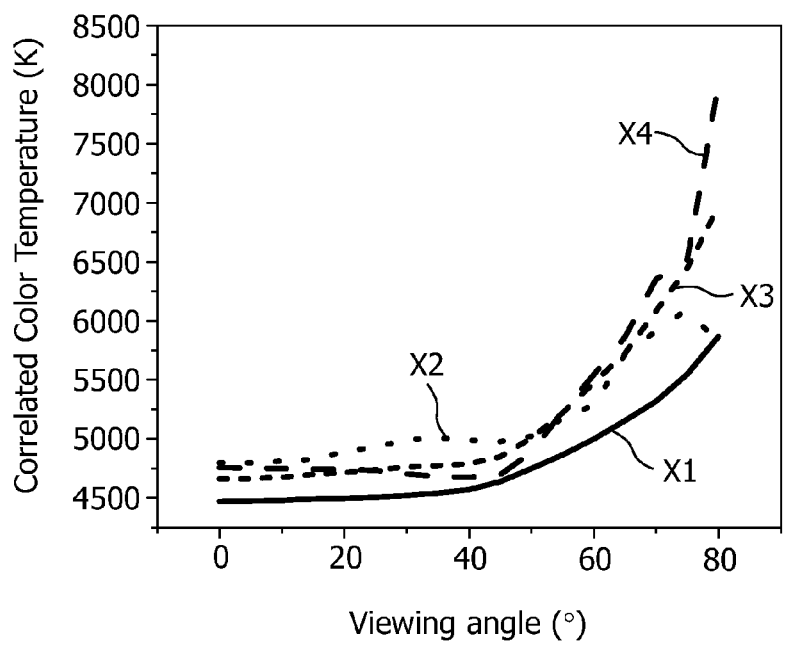
Figure 5:
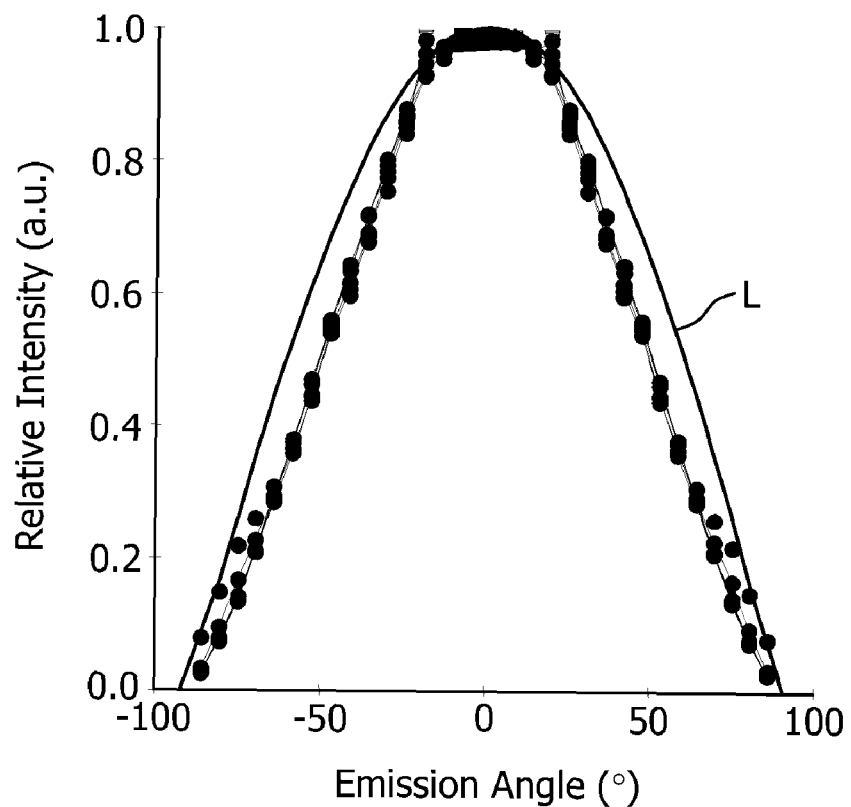
Figure 6:
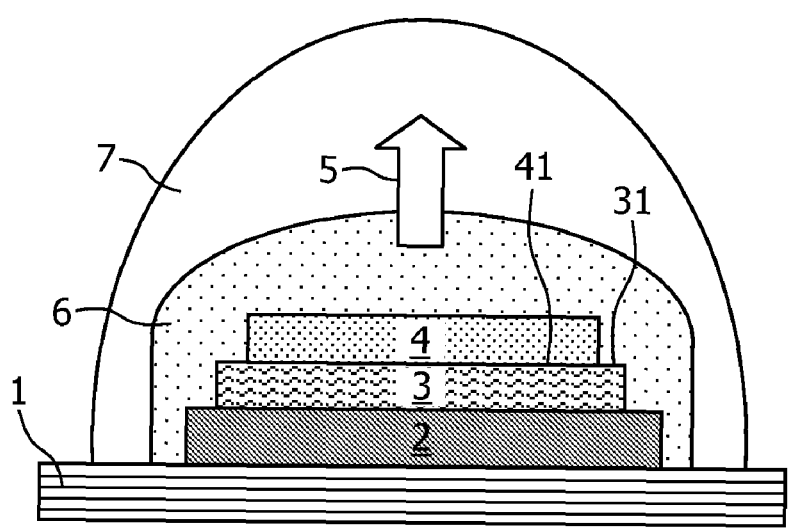
Figure 7:
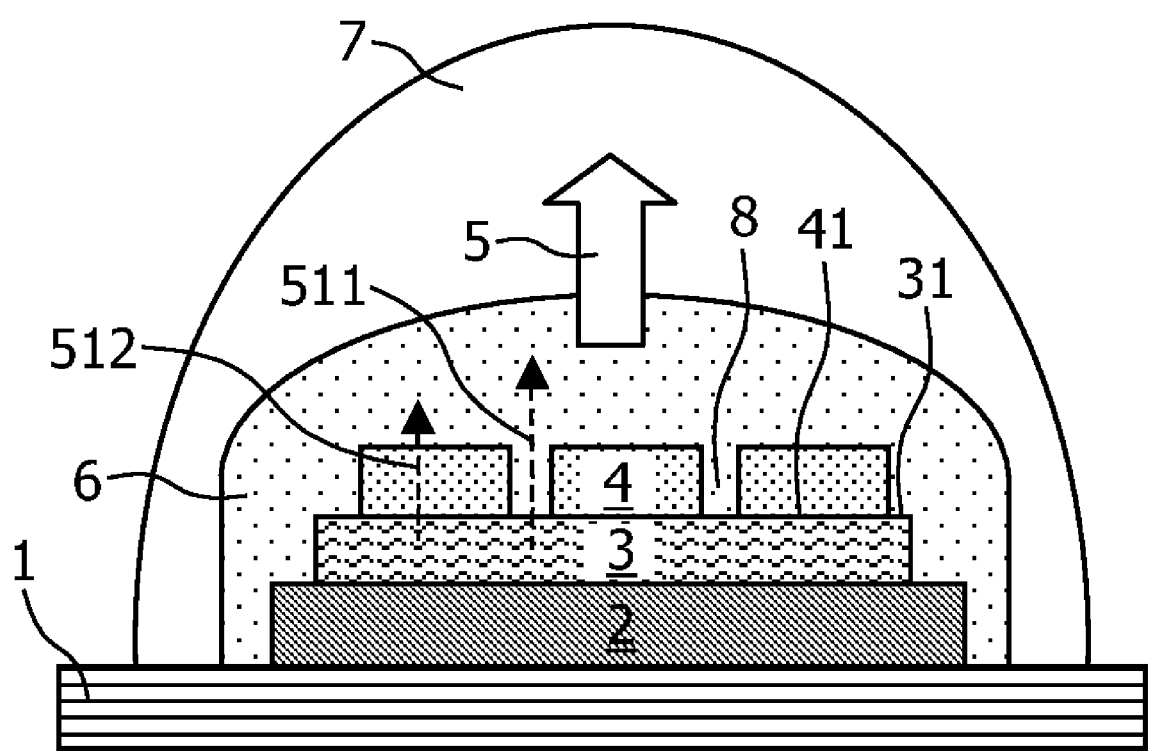

In the drawings:

FIG. 1 shows an embodiment of a light-emitting device according to the invention, in a side elevation, FIG. 2 shows a light-emitting device according to FIG. 1 having typical dimensions, in the plane of intersection A-B, without a light-scattering element, FIG. 3 is a plan view of a light-emitting device of FIG. 2, in the plane of intersection A-B, without a light-scattering element, FIG. 4 shows a correlated color temperature of the white mixed light of a light-emitting device of FIG. 3 as a function of the viewing angle for different viewing directions, FIG. 5 shows a light distribution pattern of the embodiment of the light-emitting device according to the invention, shown in FIG. 1, FIG. 6 shows a further embodiment of a light-emitting device according to the invention, with a lens, and FIG. 7 shows a further embodiment of a light-emitting device according to the invention.

FIG. 1 schematically shows an embodiment of a light-emitting device according to the invention with a carrier 1, a substrate 2 and a solid-state light source 3 provided on the substrate 2 for radiating primary radiation 511 and 512, as well as a conversion element 4 arranged in the path of the rays of the primary radiation for at least partial absorption of the second part 512 of the primary radiation and radiation of secondary radiation 521 and 522. The solid-state light source 3 and the conversion element 4 are enclosed by a light-scattering element 6 for producing mixed light 5 with a Lambertian distribution pattern. The mixed light 5 has a correlated color temperature which is dependent on the primary and the secondary radiation. The term "color temperature" is strictly applicable only for black-body radiators. The correlated color temperature denotes the temperature of that black-body emitter, whose perceived color most resembles the spectrum of the mixed light 5.

A typical solid-state light source 3 comprises an electroluminescent layer structure, applied on a substrate 2, having at least one organic or non-organic electroluminescent layer, which is arranged between two electrodes. Here, the primary radiation is emitted (top emitter) through a transparent electrode onto the side facing away from the substrate, while the electrodes facing the substrate 2 and/or the substrate 2 are reflective. The light-emitting device may also comprise several electroluminescent light sources for emitting the same and/or different primary radiation, for example, a two-dimensional arrangement of LEDs. In other embodiments, one or several laser diodes, possibly coupled to light-guiding and/or light-distribution elements may also be used as solid-state light sources.

The primary radiation emitted by the solid-state light source 3 spreads mainly perpendicularly to the light-emitting layer in the solid-state light source 3, denoted here as the second part 512 of the primary radiation (see FIG. 1). Due to the different refractive indices of the layers within the solid-state light source and the attendant effects of total reflection at the boundary surfaces, a first part 511 of the primary radiation, additionally to the second part 512 of the primary radiation, laterally exits from the solid-state light source 3 at a large angle to the average direction of radiation 5 without impinging upon the conversion element 4. Due to the light-scattering element 6 and the resultant Lambertian distribution of the mixed light, the primary radiation exiting laterally at large viewing angles (angles between the viewing direction and the average direction of propagation 5) does not lead to an increased portion of primary radiation in the mixed light. A comparable effect may also be obtained with a conversion element that encloses the solid-state light source. However, here the total primary radiation, also the non-converted radiation, must pass the conversion element. The radiationless absorption losses of a part of the primary radiation in the conversion element lead to a decrease of the effectiveness of such light sources. The light-emitting device according to the invention has a higher effectiveness as compared with such pcLEDs, as there are no absorption losses for at least a part (first part 511) of the portion needed for adjusting a desired color temperature. For a specific required portion of primary radiation for the mixed light, the effectiveness of the light-emitting device increases with the portion of the first part 511 of the primary radiation for the total non-converted primary radiation (dependent on the structure of the conversion element, its absorption strength for the second part 512 of the primary radiation may be smaller than 100%, so that unconverted primary radiation also passes through the conversion element).

The conversion element 4 is arranged for at least the partial absorption of a second part 512 of the primary radiation in the path of rays of the second part 512 of the primary radiation for converting the absorbed primary radiation into secondary radiation 521 and 522. The choice of the active material in the conversion element determines the spectrum of the secondary radiation. Differently colored light, for example, white light from blue primary radiation and yellow secondary radiation may be generated when using suitable primary and secondary radiation. In other embodiments, also ultraviolet primary radiation may be converted by suitable conversion materials and differently colored secondary radiation, for example blue, yellow, green and/or red secondary radiation. For other applications, different combinations of primary and secondary radiation may also be obtained.

In an embodiment, the conversion element 4 may comprise a pressed ceramic material of essentially light-converting phosphor material or a dimensionally stable matrix material, for example, PMMA or other materials that can be doped with particles and have embedded light-converting particles. In another embodiment, the conversion element 4 comprises a ceramic material having a density of more than 97% of the theoretical solid-state density. Due to the small intrinsic scattering effect, such a conversion element 4 emits a larger portion 521 of the secondary radiation perpendicularly to the average direction of propagation of the second part 512 of the primary radiation. This leads to a better miscibility of the first part 511 of the primary radiation with the laterally exiting secondary radiation 521. Additionally, the small scattering effect reduces the average length of the optical path for the second part 521 of the primary radiation in the conversion element 4 up to the exit from the conversion element. Thus, the portion of the radiationless re-absorption of the second part 512 of the primary radiation in the conversion element is reduced and, consequently, the efficiency of the light-emitting device is further increased. The scattering effect is obtained by means of special sintering methods, for example, by sintering the ceramic material under reducing conditions at 1700 to 1750° C. for 2 to 8 hours, which results in materials having a density >96% of the theoretical density without porosity, and by subsequently sintering the material at 1750° C. under argon gas pressure (0.500 kbar to 2 kbar) for 10 hours in order to remove residual porosities. In such ceramics for light conversion, the secondary radiation comprises a clearly higher portion of secondary radiation 521, which exits laterally from the conversion element (thus from the surface of the conversion element, whose layer normal is essentially at right angles to the direction of propagation of the second part 512 of the primary radiation), as compared with ceramics of pressed phosphor powder.

In the embodiment shown in FIG. 1, the light-scattering element 6 encloses the solid-state light source 3 and the conversion element 4. In other embodiments, the light-scattering element 6, viewed in the direction of propagation of the mixed light 5, may also be arranged above the conversion element 4, for example, in a planar form, provided that a suitable reflector arrangement of the light-emitting device leads to the fact that the total primary radiation 511 and 512 and the secondary radiation 521 and 522 pass the light-scattering element for producing a Lambertian light distribution pattern of the mixed light 5.

FIG. 2 and FIG. 3 show the dimensions of the light-emitting device of FIG. 1, shown here without the light-scattering element 6 for the sake of better clarity, in a side elevation (FIG. 2) and a plan view (FIG. 3), in a plane of intersection A-B. The solid-state light source 3 has a surface of 1 mm×1 mm and is hatched for the sake of a better representation, although it is arranged below the conversion element 4 in the plan view and thus not directly visible in the plan view. The conversion element 4 projects above the solid-state light source 3 perpendicularly to the average direction of propagation of light 5 by 0.08 mm in the X1 and X3 directions, respectively, and by 0.15 mm in the X2 and X4 directions, respectively.

Despite this projection, the solid-state light source 3 emits a noticeable first part 511 of primary radiation, which is perceivable by several thousand Kelvin, as shown in FIG. 4, in viewing angle-dependent measurements of the correlated color temperature without using a light-scattering element by shifting the correlated color temperature between small and large viewing angles. The curves in FIG. 4 represent angle-dependent measurements in the four directions denoted as X1 to X4 in FIG. 3. Therein, a viewing angle of 0° corresponds to a perpendicular plan view of the light-emitting device. Radiation in the blue or yellow spectral range was used as primary and secondary radiation. In the plan view, white mixed light with a color temperature in the range of 4700 Kelvin resulted, while the color temperature of the white light is up to 8000 Kelvin at large viewing angles and thus comprises a high portion of blue primary radiation.

In the given composition of the material, the thickness of the conversion element 4 is to be adapted to the desired ratio between the primary and the secondary radiation. Here, it is advantageous if the conversion element 4 has a thickness of at least 30 μm, viewed in the direction of radiation 5.

In this case, the conversion element 4 can be applied directly onto the solid-state light source 3 or optically coupled to the solid-state light source 3 by means of transparent materials. For the optical coupling of the conversion element 4 to the solid-state light source 3, for example, adhesion layers of flexible or hard materials having a refractive index between 1.4 and 3.0 for primary radiation may be used between the conversion element 4 and the solid-state light source 3, for example, cross-linkable two-component silicon rubbers which are platinum cross-linked, or also glass materials which are connected at high temperatures with the solid-state light source 3 and the conversion element 4. Furthermore, it is particularly advantageous if the conversion element 4 is brought into close contact with the solid-state light source 3.

In FIG. 5, the light distribution pattern of a light-emitting device according to the invention, as shown in FIG. 1, is shown with the dimensions indicated in FIG. 2 and FIG. 3 as a function of the emission angle for the primary radiation at a wavelength of 470 nm. Here, the light-scattering element 6 envelopes the solid-state light source 3 and the conversion element 4 with an average thickness of 600 μm. The thickness details are to be understood here as the thickness along the optical path for the primary and secondary radiation. The solid-line curve marked by "L" in FIG. 5 represents an ideal Lambertian light distribution. The light-scattering element comprises a silicon matrix material (refractive index n=1.45), in which scattering particles with an average diameter of 0.2 μm and a volume concentration of 0.05% are embedded. The measuring curves were measured for corresponding particles, which differ only in refractive indices of n=1.6 up to 2.6. The light distribution patterns measured in FIG. 5 are almost independent of the refractive index; hence, all measuring points were represented by the same symbols. If the influence of the light-scattering element 6 on the light distribution of the primary radiation after passing through the light-scattering element 4 is considered, large differences in the different particle sizes are found. Whereas particles below approximately 500 nm diameter distribute the transmitted light via all angles similar to a Lambertian distribution, larger particles change the angular distribution of the transmitted light substantially only when an optically very thick layer (small transmission power) is used. For example, the light distribution differs clearly at a primary radiation with a wavelength of 470 nm from a Lambertian distribution if the embedded particles have an average diameter of 1.0 µm at the same concentration as in FIG. 4. This result is essentially independent of the refractive index of the particles. For average particle diameters between 0.2 µm and 0.5 µm, light distribution patterns are obtained that are very close to an ideal Lambertian distribution. The best result for a refractive index of the particles from 1.8 to 2.0 is obtained at average particle diameters of 0.2 µm. The best result for a refractive index of the particles larger than or equal to 2.1 is obtained at average particle diameters of 0.3 µm and 0.4 µm. The best result for a refractive index of the particles from 1.9 to 2.3 is obtained at average particle diameters of 0.5 µm. The light distribution pattern deviates clearly from a Lambertian distribution at average particle diameters of 0.05 µm and less. The figures for the refractive indices are to be understood in the context of the refractive index differences with the matrix material, in the indicated examples silicon with n=1.45. For other matrix materials, the advantageous refractive indices of the particles are to be adapted accordingly. Additionally, if the particle concentration $V_T$ in percent and the thickness D of the light-scattering element 6 in micrometers are taken into consideration, an advantageous product of particle concentration and thickness $V_T*D$ of the light-scattering element 6 is between 0.1 and 3, still more advantageously between 0.2 and 1. $ZrO_2$ or $TiO_2$ may be used, for example, as light-scattering particles. However, also light-scattering particles of other materials are known to those skilled in the art. At the same average particle diameter, the light-scattering properties as a function of the wavelength for a light-scattering element 6 can be influenced by the variation of the particle diameters. The distribution usually corresponds to a logarithmic normal distribution with a width 6 of the distribution. For example, for $ZrO_2$ particles (n=2.2) with a volume concentration of 0.05% in silicon with a distribution width 6 of the particle diameter between 0.06 and 0.3, a reflection behavior (scattering behavior) of the particles that is only slightly dependent on the wavelength is obtained, which reflection behavior is, however, additionally still influenced by the particle size.

EMBODIMENT

In a geometry of the light-emitting device selected according to FIG. 1, a blue emitting LED with a maximum emission at 450 nm and a YAG:Ce ceramic material applied on the solid-state light source were used as a solid-state light source for producing yellow secondary radiation from a ceramic material having a density of 98% of the theoretical solid-state density. The ceramic disk had a thickness of 250 µm. The raw material of the ceramic disk was manufactured by 12 hours of grinding 40 g of $Y_2O_3$, 32 g of $Al_2O_3$ and 3.44 g of $CeO_2$ in isopropanol by means of 1.5 kg of $Al_2O_3$ grinding balls, and subsequent burning of the dried powder at 1300° C. in a CO atmosphere. The YAG:Ce powder obtained was deagglomerated in ethyl alcohol by means of a planet ball mill having agate-grinding cups, and subsequently ceramic green bodies (diameter 100 mm, height 2 mm) were manufactured by means of slip casting in plaster molds. After drying, the green bodies were burned on graphite disks in a CO atmosphere at 1700° for two hours. Subsequently, the YAG ceramic aterial was sawn to 290 µm, surface-ground and polished. The density of the ceramic material is 98% of the theoretical density. The necessary ceramic disks are then cut out with a laser and cleaned. The transmission of the ceramic material was 80% at a wavelength of 600 nm. Between the ceramic disk and the LED there was a thin layer of silicon gel having a thickness smaller than 10 µm of the firm of Gelest Inc PP2-D200 Gelest gel D200 for optically coupling the ceramic disk to the solid-state light source. Subsequently, a spherical lens was fitted, whose gap 6 was filled with silicon gel including embedded light-scattering particles. In this embodiment, this filled gap 6 represents the light-scattering element 6. The particles embedded in the silicon gel comprised $ZrO_2$ with an average particle diameter of 0.25 µm. The light distribution showed a 92% conformity with an ideal Lambertian distribution pattern and hence corresponds very well to a Lambertian distribution.

In another embodiment, colored pigments may also be used as scattering particles for further modifying the correlated color temperature. Inorganic materials are particularly suitable as materials, whose refractive index is in the range desired here. Such materials are, for example, $CoO$—$Al_2O_3$ and ultramarine for blue-emitting pigments, $TiO_2$—$CoO$—$NiO$—$ZrO_2$, $CeO$—$Cr_2O_3$—$TiO_2$—$Al_2O_3$, $TiO_2$—$ZnO$—$CoO$—$NiO$ for green-emitting pigments and $Fe_2O_3$, $CdS$—$CdSe$, $TaON$ for red emitting pigments.

The portion of the hitherto unconverted primary radiation reflected back on the conversion element during scattering in the light-scattering element 6 may be used in other embodiments so as to further adapt the correlated color temperature of the mixed light 5.

In a further embodiment, shown in FIG. 6, the solid state light source has a lens 7, which encloses solid-state light source 3, conversion element 4 and light-scattering element 6. The solid-state light source 3, viewed in the direction of radiation of the mixed light 5, has a light-emitting surface 31 which is larger than or equal to the surface 41 of the conversion element 4, which faces the solid-state light source 3. In this way, the portion of the first part of the primary radiation 511 for the total primary radiation can be increased. In this embodiment, at least the total primary radiation exiting laterally from the solid-state light source 3 does not pass the conversion element 4. If the surface 41 of the conversion element 4 is smaller than the light-emitting surface 31, as shown in FIG. 6, then, in addition to the laterally exiting primary radiation 511, also a part of the primary radiation exiting parallel to the average direction of radiation 5 does not pass the conversion element 4. Thus, the portion of the primary radiation, which does not pass the conversion element, is further increased.

In a further embodiment, shown in FIG. 7, the solid state light source has a lens 7, which encloses solid-state light source 3, conversion element 4 and light-scattering element 6. The conversion element 4 has at least one opening 8, through which the primary radiation can pass without passing the conversion element 4. The required increase of the portion of the first part 511 of the primary radiation for the total primary radiation further increases the effectiveness of the light-emitting device. The average direction of propagation of the portion of the primary radiation 511 that passes through the openings 8 is at least very similar to the average direction of propagation of the secondary radiation and renders a less expensive and elaborate light-scattering element 6 possible for generating a Lambertian distribution. The openings 8 should not be understood here as part of the conversion element. The openings may be filled either with a gas, for example, air or with another transparent and non-scattering material, for example, silicon.

The embodiments explained with reference to the Figures and the description only represent examples of a light-emitting device according to the invention for the effective emission of mixed light with a Lambertian distribution and should not be construed as limiting the patent claims to these examples. Alternative embodiments, which are also within the protective scope of the appending claims, can also be conceived by those skilled in the art. The numbering of the dependent claims should not imply that other combinations of the claims do not represent favorable embodiments of the invention. Moreover, use of the indefinite article "a" or "an" in the description and claims does not exclude a plurality of arrangements, units or elements.

The invention claimed is:

1. A light-emitting device comprising a solid-state light source, at least one conversion element and a light-scattering element, wherein
the solid-state light source is provided to emit a first part of a primary radiation for entry into the light-scattering element and a second part of a primary radiation for entry into the conversion element for at least partial conversion into at least one secondary radiation,
the light-scattering element is provided to generate a mixed radiation having a Lambertian light distribution from the first part of the primary radiation, the secondary radiation and a portion of the second part of the primary radiation that has not been converted in the conversion element, and
the first part of the primary radiation leaves the light-emitting device without having passed the conversion element.

2. A light-emitting device as claimed in claim 1, characterized in that the conversion element comprises a ceramic material having a density which is larger than 97% of the theoretical solid-state density of the crystalline connection.

3. A light-emitting device as claimed in claim 1, characterized in that the conversion element has a thickness of at least 30 μm in the average direction of radiation of the second part of the primary radiation.

4. A light-emitting device as claimed in claim 1, characterized in that the solid-state light source, viewed in the direction of radiation of the mixed light, has a light-emitting surface which is larger than or equal to the surface of the conversion element, which faces the solid-state light source.

5. A light-emitting device as claimed in claim 1, characterized in that the conversion element has at least one opening, through which the primary radiation can pass without passing the conversion element.

6. A light-emitting device as claimed in claim 1, characterized in that the conversion element is optically coupled to the solid-state light source.

7. A light-emitting device as claimed in claim 1, characterized in that the light-scattering element encloses the solid-state light source and the conversion element.

8. A light-emitting device as claimed in claim 1, further comprising a lens, which encloses the solid-state light source, the conversion element and the light-scattering element.

9. A light-emitting device as claimed in claim 1, characterized in that the color point of the mixed light is adjusted via a portion of unconverted primary radiation that is adjustable by means of the scattering properties of the light-scattering element, which primary radiation is scattered back to the conversion element for conversion into secondary radiation.

10. A light-emitting device as claimed in claim 1, characterized in that the light-scattering element comprises reflective and/or refractive particles of the same or different size, material and concentration for producing a mixed radiation having a Lambertian light distribution.

11. A light-emitting device as claimed in claim 10, characterized in that the particles comprise materials from a group of pigments for absorbing primary and or secondary radiation.

12. A light-emitting device as claimed in claim 10, characterized in that the particles comprise materials from the group of pigments for absorbing primary and or secondary radiation and subsequent re-emission at a different wavelength.

* * * * *